US008923353B2

(12) United States Patent
Dvir et al.

(10) Patent No.: US 8,923,353 B2
(45) Date of Patent: Dec. 30, 2014

(54) LASER DRIVER MODULATION AND BIAS CONTROL SCHEME (71) Applicant: Broadcom Corporation, Irvine, CA (US)

(72) Inventors: Amiad Dvir, Nes Ziona (IL); Asaf Koren, Netanya (IL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/842,745

(22) Filed: Mar. 15, 2013

(65) Prior Publication Data
US 2014/0119395 A1 May 1, 2014

Related U.S. Application Data (60) Provisional application No. 61/719,262, filed on Oct. 26, 2012.

(51) Int. Cl.
H01S 3/00 (2006.01)
H04B 10/272 (2013.01)
H01S 5/0683 (2006.01)
H04B 10/50 (2013.01)

(52) U.S. Cl.
CPC .......... H01S 5/06832 (2013.01); H04B 10/272 (2013.01); H04B 10/504 (2013.01)
USPC .................. 372/38.01; 372/38.02; 372/38.07

(58) Field of Classification Search
USPC ................. 372/29.011, 29.015, 38.01, 38.02, 372/38.07
See application file for complete search history.

(56) References Cited

U.S. PATENT DOCUMENTS

2009/0225803 A1* 9/2009 Sanchez ..................... 372/38.02

* cited by examiner

Primary Examiner — Armando Rodriguez
(74) Attorney, Agent, or Firm — Sterne, Kessler, Goldstein & Fox PLLC (57) ABSTRACT Systems and methods are provided for generating an accurate, stable measurement for a laser bias current. The average current and the extinction ratio are controlled using a dual control loop. The transfer function between the laser and a monitor photo diode (MPD) is characterized. A laser driver control module predicts the average power that will be measured using the MPD relative to the data being transmitted, and this information is used to control a laser driver.

20 Claims, 8 Drawing Sheets

LASER DRIVER MODULATION AND BIAS CONTROL SCHEME

CROSS REFERENCE TO RELATED APPLICATIONS

This application claims the benefit of U.S. Provisional Patent Application No. 61/719,262, filed on Oct. 26, 2012, which is incorporated by reference herein in its entirety.

FIELD OF THE INVENTION

This invention relates to lasers and more specifically to direct modulation laser driver control.

BACKGROUND

Lasers are used in a variety of applications (e.g., in optical networks), and the operation of lasers can be controlled by modulating the current of a laser using a laser driver. Lasers use particular bias currents to set an appropriate operating point for the laser. For example, the bias current can be used to set the optical power to represent a logical '0' level in a signal used for laser transmissions (the "bias point"). A modulation current can be used to set the optical power of a logic '1' level of a signal used for laser transmissions (the "modulation point"), where the logic '1' level is set relative to the '0' level that is determined by the bias current. In many applications (e.g., burst mode and continuous mode), different control schemes are applicable for setting the bias current and modulation current according to temperature, monitor photo diode (MPD) average levels, etc.

For example, a laser may be used to transmit different levels of an optical signal representing binary data. If there is a small difference between the '0' optical level and the '1' optical level, it can be difficult for a receiver to differentiate between the two levels and extract the content of the transmitted data. The two transmitted levels are directly correlated to laser characteristics, such as the Current to Optical characteristics (how much current is converted to how much light), and so the two transmitted levels are directly related to the currents that the laser driver drives through the laser.

Thus, a laser driver ideally tries to maintain an average configured optical power while trying to maintain a large enough difference between the '0' optical level and the '1' optical level. For a burst mode transmission, where the modulated signal is directly added to a bias current signal, the '0' optical level is generated by the bias signal, while the '1' optical level is generated by the bias current+the modulation current. Thus, the laser driver should ideally attempt to generate a current that will transmit an optical signal of '0' as close as possible to the target optical bias point and transmit a '1' as close as possible to the target modulation point so that a receiver can easily differentiate between a transmitted '0' and '1.' Typically, most systems only monitor the average power (the average of the power transmitted between the bias point and the modulation point) because of the difficulty in extracting the actual high speed optical levels of transmitted '0's' and '1's.'

A key challenge in designing a laser system is generating a stable, accurate bias current and modulation current that ensure the required optical characteristics. This challenge is complicated by the laser's changing of the Current to Optical characteristic as temperature and the lifetime of the laser varies. Achieving the correct levels of bias and modulation is important for improving optical signal quality, including improving optical signal quality factors such as jitter, extinction ratio, duty cycle distortion, etc. Embodiments of the present disclosure provide methods and systems for efficient, accurate bias and modulation current control of a laser driver.

BRIEF DESCRIPTION OF THE DRAWINGS/FIGURES

The accompanying drawings, which are incorporated in and constitute part of the specification, illustrate embodiments of the disclosure and, together with the general description given above and the detailed descriptions of embodiments given below, serve to explain the principles of the present disclosure. In the drawings.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

In the following description, numerous specific details are set forth to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

1. OVERVIEW

Systems and methods according to embodiments of the present disclosure use a dual control loop to efficiently and accurately control the average optical signal and the extinction ratio (i.e., the ratio between the '0' power level and the '1' power level in a transmitted signal) in a direct modulated laser signal. A laser driver control module can determine the average power transmitted by a laser based on a current generated by a monitor photo diode (MPD) that is exposed to optical power transmitted by the laser. Using the average power information and the sequence of '1's and '0's being transmitted by the laser, the laser driver control module can characterize a transfer function between the transmitted information and the average power. The laser driver can use the transfer function to predict the average power relative to data that will be transmitted. Using these predictions, the laser driver control module can configure a control loop to accurately compensate for the average power and for an expected '1' level and '0' level of the transmitted power.

2. PASSIVE OPTICAL NETWORK TOPOLOGY

As previously discussed, lasers are used in a variety of applications. One application that can use lasers and lasers is an optical network. In an embodiment, a laser driver and a laser driver control module in accordance with embodiments of the present disclosure can be implemented in an optical network unit (ONU) of a passive optical network (PON). PON topology will now be described with reference to FIGS. 1 and 2. However, it should be understood that embodiments of the present disclosure are not limited to optical network applications.

A PON is a point-to-multipoint network architecture comprising an optical line terminal (OLT) at the service provider and ONUs at subscribers for providing the subscribers with broadband services. New standards have been developed to define different types of PONs, each of which serves a different purpose. For example, the various PON types known in the related art include a Broadband PON (BPON), an Ethernet PON (EPON), ten Gigabit-Ethernet PON (10G-EPON) a Gigabit PON (GPON), ten-Gigabit PON (XG-PON), and others.

Figure 1A:
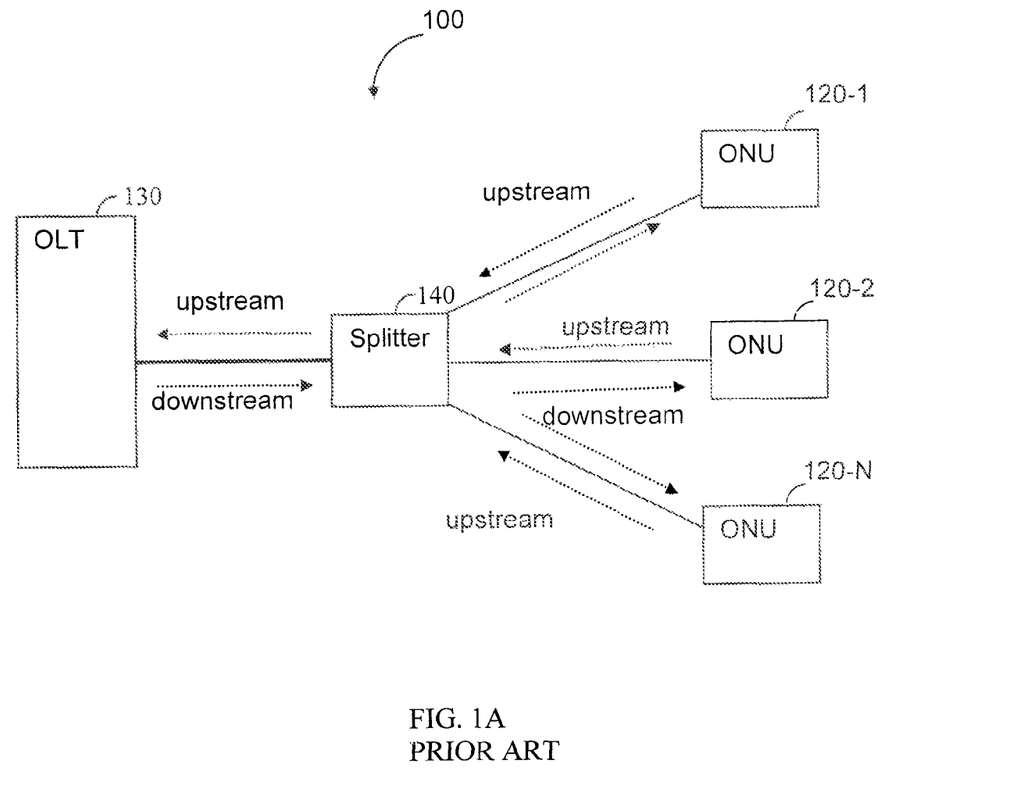
FIG. 1A is a schematic diagram of a passive optical network (PON).

An exemplary diagram of a typical PON 100 is schematically shown in FIG. 1. The PON 100 includes N ONUs 120-1 through 120-N (collectively referred to as ONUs 120) connected to an OLT 130 via a passive optical splitter 140 and the optical fiber. In a GPON, for example, traffic data transmission is achieved using a GPON encapsulation method (GEM) over two optical wavelengths, one for the downstream direction and another for the upstream direction. Thus, downstream transmission from OLT 130 is broadcast to all ONUs 120. Each ONU 120 filters its respective data according to pre-assigned labels (e.g., GEM port-IDs in a GPON). In an embodiment, splitter 140 is a 1 to N splitter (i.e., a splitter capable of distributing traffic between single OLT 130 and N ONUs 120).

In most PON architectures, the upstream transmission is shared between ONUs 120 in a time division multiple access (TDMA) based access scheme controlled by OLT 130. TDMA requires that OLT 130 first discovers the ONUs and measures their round-trip-time (RTT) before enabling coordinated access to the upstream link. With this aim, OLT 130, during a ranging state, tries to determine the range between the terminal units (i.e., ONUs 120) to find out at least the RTT between OLT 130 and each of ONUs 120. The RTT of each ONU 120 is necessary in order to coordinate a TDMA based access of all ONUs 120 to the shared upstream link. During a normal operation mode, the range between the OLT 130 to the ONUs 120 may change over time due to temperature changes on the fiber links (which results with varying signal propagation time on the fiber). Thus, OLT 130 continuously measures the RTT and adjusts the TDMA scheme for each ONU accordingly.

Figure 1B:
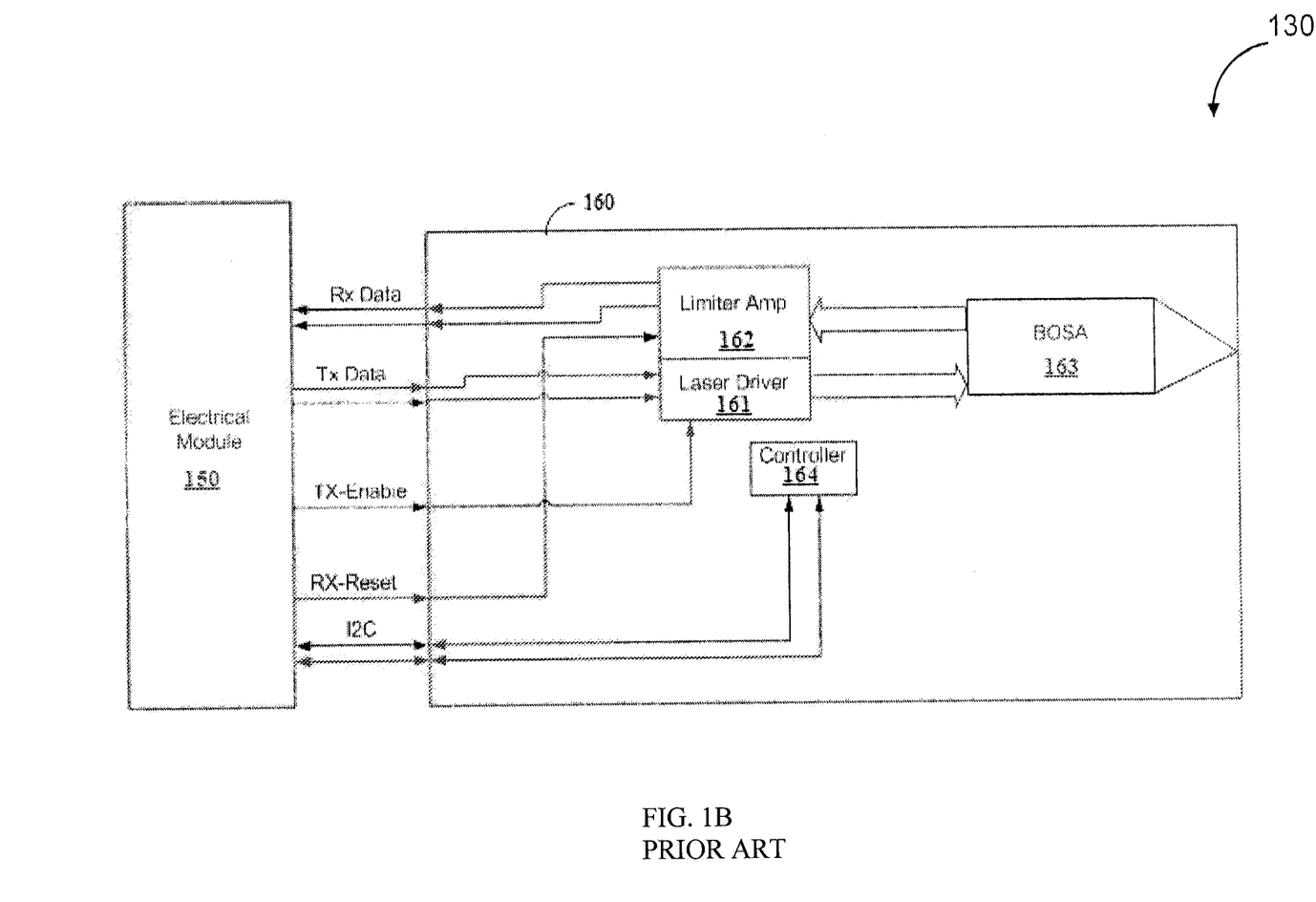
FIG. 1B is a block diagram of a conventional optical line terminal (OLT).

As schematically shown in FIG. 1B, OLT 130 (operable, for example, in a GPON or XG-PON) includes an electrical module 150 and an optical module 160. Electrical module 150 is responsible for the processing of received upstream burst signals and generating downstream signals. Electrical module 150 typically includes a network processor and a media access control (MAC) adapter designed to process and handle upstream and downstream signals according to a respective PON standard.

Optical module 160 in most cases is implemented as a small form-factor pluggable (SFP) transceiver that receives optical burst signals sent from ONUs (e.g., ONUs 120) and transmits continuous optical signals to the ONUs. The reception and transmission of signals is over two different wavelengths. For example, in a GPON, in the downstream direction, the optical module 160 generates an optical signal of 1480 nm to 1500 nm (as referred to 15XY), and, in the upstream direction, optical module 160 receives optical signals between 1260 nm and 1360 nm (also referred to as 13XY in GPON).

Optical module 160 includes a laser driver diode 161 coupled to a transmit laser diode that produces optical signals based on the electrical signals provided by laser diode driver 161. Optical module 160 also includes a limiter amplifier 162 coupled to a receive photodiode that produces current in proportion to the amount of light of the optical input burst signal. Limiter amplifier 162 generates two current levels indicating if a received burst signal is or '0' logic value.

The receiver/transmitter optical elements (i.e., a photodiode and laser diode) are realized as a bidirectional optical sub-assembly (BoSa) module 163 that can transmit and receive high rate optical signals. Optical module 160 also includes a controller 164 that communicates with electrical module 150 through the I2C interface and performs tasks related to calibration and monitoring of the transceiver.

OLT vendors typically develop and fabricate electrical module 150 of OLT 130, where optical module 160 is often an off-the-shelve transceiver, such as SFP, XFP and the like. Thus, the interface between electrical module 150 and optical module 160 is a standard interface being compatible with any type of SFP transceiver. As illustrated in FIG. 1B, the interface includes wires for receive (RX) data, transmit (TX) data, TX-enabled signal, RX-Reset signal, and I2C for interfacing between electrical module 150 and controller 164. The I2C interface is a relatively slow serial interface with a data rate of up to 4 Mb/sec. In contrast, the RX data and TX data interfaces are high speed interfaces where the data rate of signals over these interfaces is as the data rate of the PON (e.g., 1 Gb/sec in a GPON).

Ethernet passive optical networks (EPONs) combine the Ethernet packet framework with PON technology. Hence, they offer the simplicity and scalability of Ethernet with the cost-efficiency and high capacity of passive optics. In particular, due to the high bandwidth of optical fibers, EPONs are capable of accommodating broadband voice, data, and video traffic simultaneously. Furthermore, EPONs are more suitable for Internet Protocol (IP) traffic, since Ethernet frames can directly encapsulate native IP packets with different sizes, whereas ATM passive optical networks (APONs) use fixed-size ATM cells and consequently require packet fragmentation and reassembly.

Typically, EPONs are used in the "first mile" of the network, which provides connectivity between the service provider's central offices and business or residential subscribers. Logically, the first mile is a point-to-multipoint network, with a central office servicing a number of subscribers. A tree topology can be used in an EPON, wherein one fiber couples the central office to a passive optical splitter, which divides and distributes downstream optical signals to subscribers and combines upstream optical signals from subscribers (see FIG. 2A).

Figure 2A:
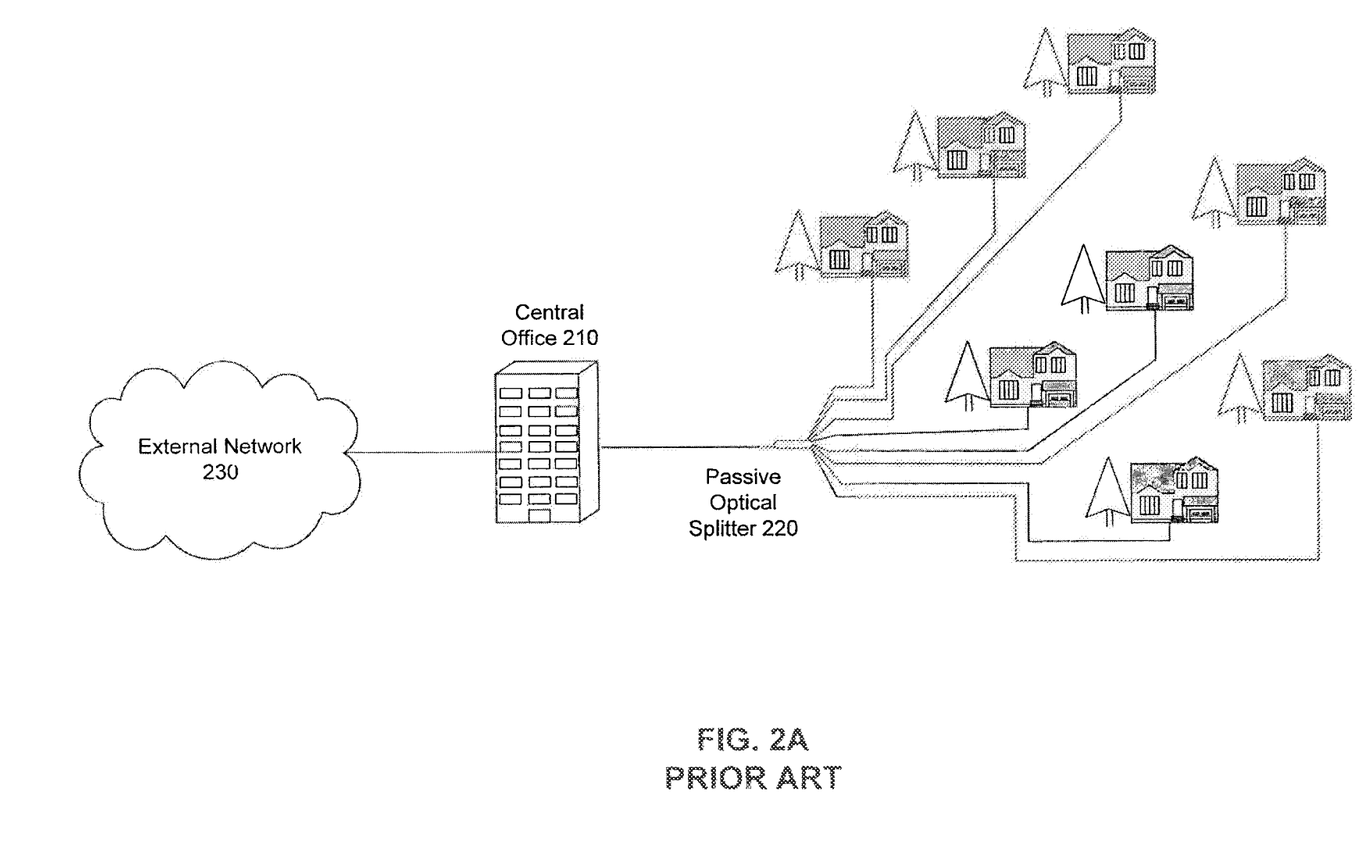
FIG. 2A illustrates an Ethernet passive optical network (EPON) wherein a central office and a number of subscribers are coupled together through optical fibers and a passive optical splitter.
Figure 2B:
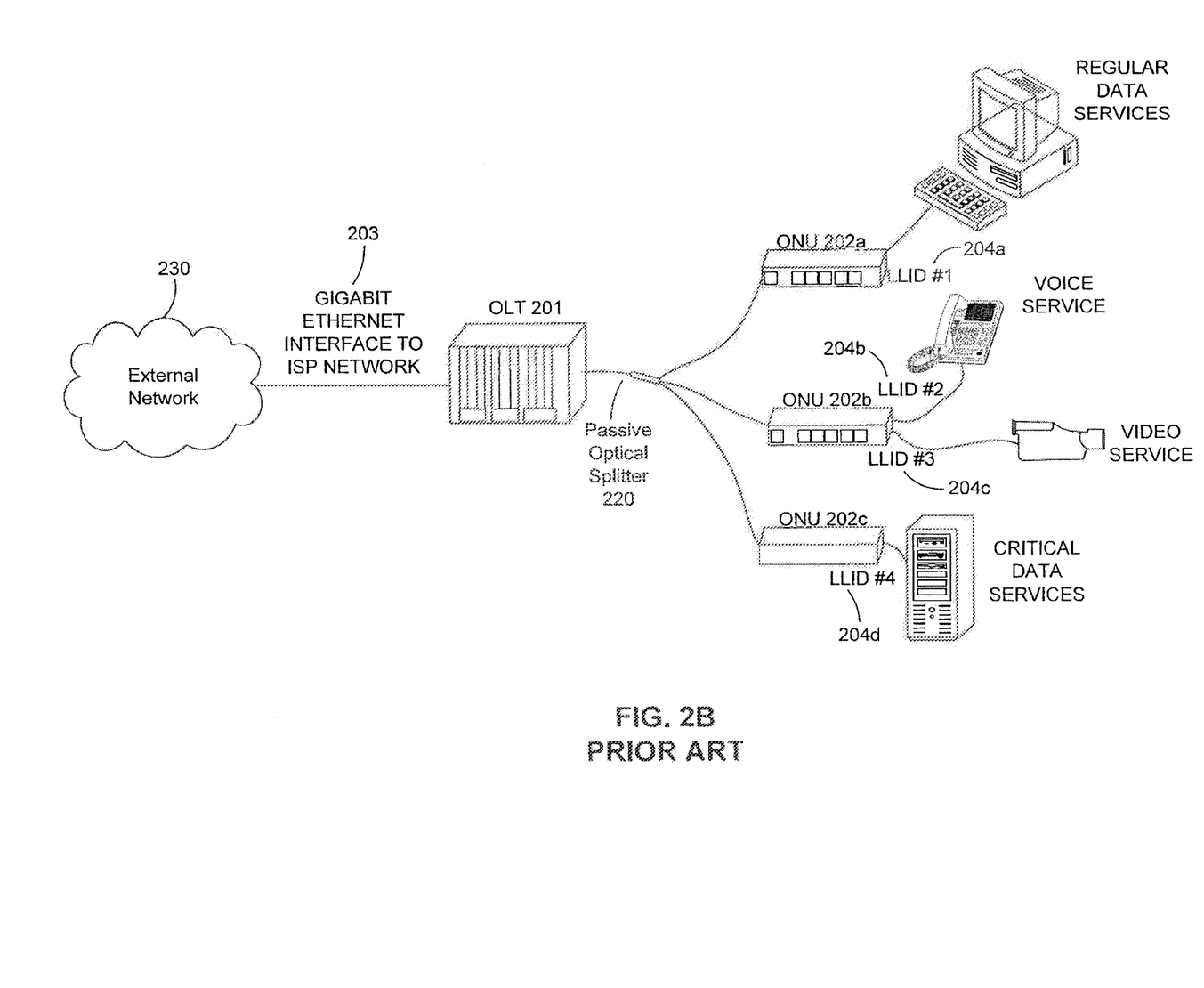
FIG. 2B illustrates a passive optical network including a single OLT and multiple ONUs.

Transmissions within an EPON are typically performed between an optical line terminal (OLT) and optical networks units (ONUs) (see FIG. 2B). The OLT generally resides in a central office (e.g., central office 210 in FIG. 2A) and couples the optical access network to the metro backbone, which is typically an external network belonging to an ISP or a local exchange carrier. The ONU can be located either at the curb or at an end-user location, and can provide broadband voice, data, and video services. ONUs are typically coupled to a one by N (1×N) passive optical coupler, where N is the number of ONUs, and the passive optical coupler is typically coupled to the OLT through a single optical link. This configuration can achieve significant savings in the number of fibers and amount of hardware required by EPONs.

Communications within an EPON can be divided into upstream traffic (from ONUs to OLT) and downstream traffic (from OLT to ONUs). In the upstream direction, the ONUs need to share channel capacity and resources, because there is only one link coupling the passive optical coupler with the OLT. In the downstream direction, because of the broadcast nature of the 1×N passive optical coupler, downstream data frames are broadcast by the OLT to all ONUs and are subsequently extracted by their destination ONUs based on their individual Logic Link Identifiers (LLIDs). An LLID carries physical address information for a frame and determines which ONU is allowed to extract the frame.

FIG. 2A illustrates a an Ethernet passive optical network (EPON), wherein a central office and a number of subscribers are coupled together through optical fibers and a passive optical splitter. As shown in FIG. 2A, a number of subscribers are coupled to a central office 210 through optical fibers and a passive optical splitter 220. Passive optical splitter 220 can be placed in the vicinity of end-user locations, so that the initial fiber deployment cost is minimized. Central office 210 can be coupled to an external network 230, such as a metropolitan area network operated by an Internet service provider (ISP). Note that although FIG. 2A illustrates a tree topology, an EPON can also be based on other topologies, such as a ring or a bus.

FIG. 2B illustrates an EPON including a single OLT and multiple ONUs. OLT 201 resides in a central office (e.g., central office 210 in FIG. 2A) and is coupled to external network 230 via interface 203. OLT 201 is coupled to ONUs 202 through optical fibers and passive optical splitter 220. As is illustrated in FIG. 2B, an ONU (e.g., any of ONUs 202) can accommodate a number of networked devices, such as personal computers, telephones, video equipment, network servers, etc. One or more networked devices belonging to the same class of service are typically assigned a Logical Link ID (LLID), as defined in the IEEE 802.3 standard. LLIDs 204 can represent, for example, a customer or a service for a customer, or they can be used for some other purpose. An LLID establishes a logical link between an ONU (e.g., any of ONUs 202) and OLT (e.g., OLT 201), which accommodates specific service level agreement (SLA) requirements. In this example, LLID #1 204a is assigned to regular data services for ONU 202a, LLID #2 204b is assigned to voice services for ONU 202b, LLID #3 204c is assigned to video services for ONU 202b, and LAD #4 204d is assigned to critical data services for ONU 202c.

3. LASER DRIVER CONTROL 3.1 Laser Driver Control System

A system 300 for accurately configuring a laser driver in accordance with an embodiment of the present disclosure will now be described with respect to FIG. 3. In an embodiment, system 300 is implemented in an ONU (e.g., ONU 120-1 of FIG. 1A or ONU 202a of FIG. 2B) of a PON (e.g., a GPON, XGPON, or an EPON). System 300 includes a laser driver control module 302 coupled to a laser driver 304. Laser driver 304 generates an analog signal based on a '1' or a '0' pattern transmitted to the laser driver via data input signal 314. Laser driver control module 302 is used to accurately control the bias current and modulation current of laser driver 304 so that a receiver can more easily differentiate between a transmitted '1' and a transmitted '0.'

Laser module 306 includes a laser 308 and a monitor photo diode (MPD) 310 used to determine the average power level of the signal transmitted by laser 308. For example, in an embodiment, laser 308 and MPD 310 of laser module 306 are co-located or coupled in such a way that MPD 310 is exposed to a sufficient percentage of the optical power transmitted by laser 308 such that MPD 310 can generate a current based on this optical power. MPD 310 sends this current to laser driver control module 302, which can use it to determine the average optical power transmitted by laser 308.

According to embodiments of the present disclosure, by determining the limited bandwidth power detected using MPD 310, laser driver control module 302 can control not only the average power transmitted by laser 308 but also the extinction ratio (i.e., the ratio between the '0' power level and the '1' power level) of the signal transmitted by laser 308. For example, FIG. 4 shows a diagram of two signals 400 and 402 that can be transmitted by laser 308. Both signals 400 and 402 have the same average power 404. However, the ratio between the transmitted '1's' 406a and '0's' 406b of signal 400 differs from the ratio between the transmitted '1's' 408a and '0's' 408b of signal 402. If there is a small difference between the power level of a transmitted '0' and a transmitted '1,' (e.g., as shown in signal 402) it can be difficult for a receiver to differentiate between the '0's' and '1's' in a signal. Thus, by controlling the currents associated with the '1's' and '0's' transmitted by laser 308, laser driver control module 302 can configure laser driver 304 to transmit a '0' as close as possible to a target bias (or '0' level) point and to transmit a '1' as close as possible to a target modulation point (or '1' level) point so that a receiver can easily differentiate between a transmitted '0' and a transmitted '1.' Such a scheme will maintain the extinction ratio of the signal transmitted by laser 308 and will still be able to maintain the average power 404.

Figure 3:
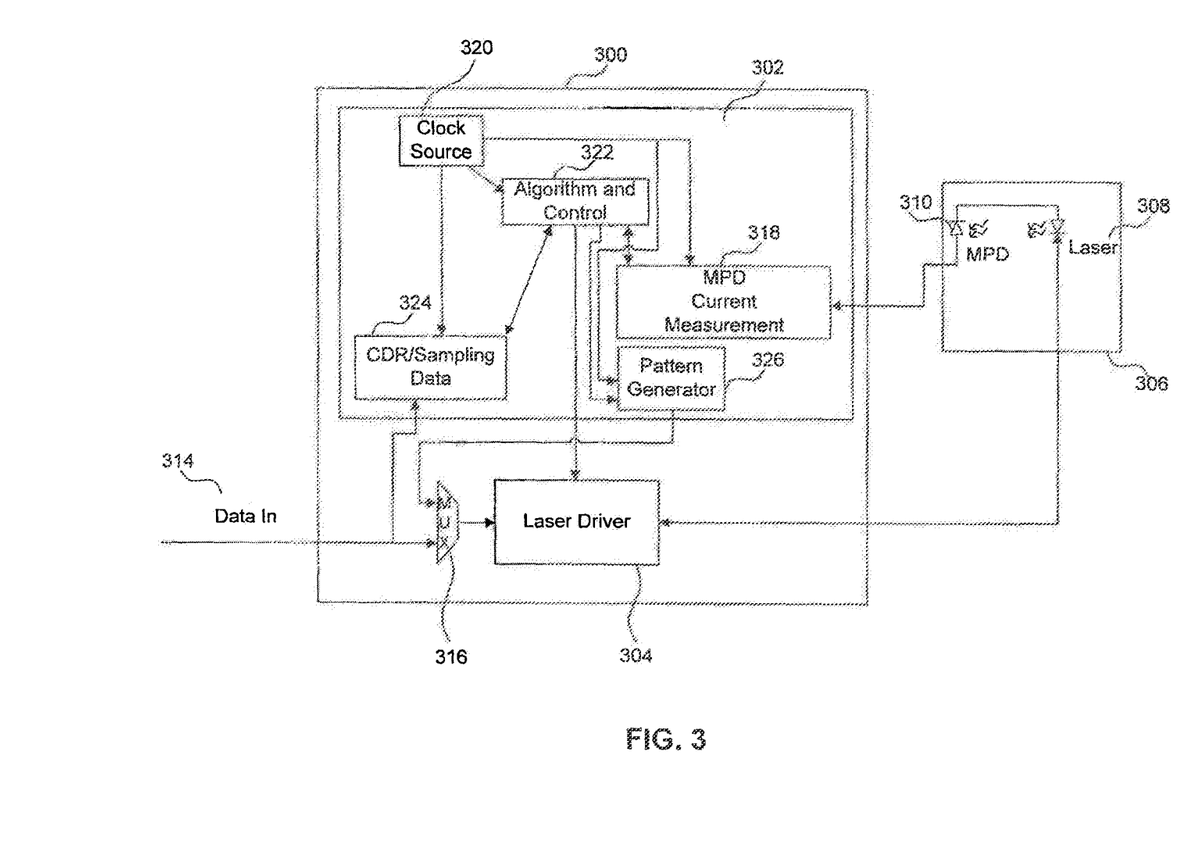
FIG. 3 is a diagram of a system for accurately configuring a laser driver in accordance with an embodiment of the present disclosure.
Figure 4:
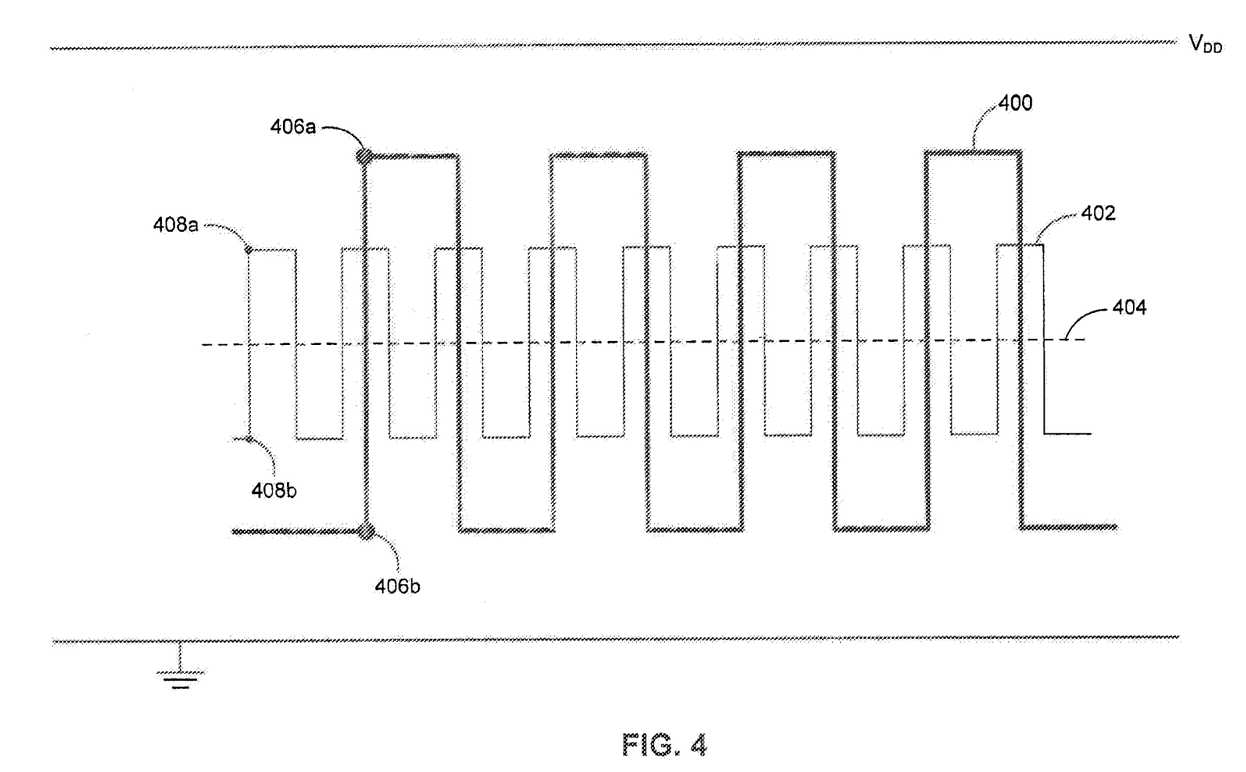
FIG. 4 is a diagram of two signals that can be transmitted by a laser.

It should be understood that the elements of FIG. 3 can be implemented on one or more integrated circuits (IC's). For example, in an embodiment, laser driver control module 302 and laser diver 304 are implemented on a shared integrated circuit (e.g., on the same chip). In an embodiment, laser driver control module 302 and laser driver 304 are implemented on separate IC's. Additionally, in an embodiment, laser driver control module 302, laser driver 304, and laser module 306 are all implemented on the same IC.

3.2 Laser Driver Control Module

Laser driver control module 302 of FIG. 3 will now be described in greater detail. In an embodiment, laser driver control module 302 configures the bias current and/or the modulation current of laser driver 304 using algorithm and control module 322. Algorithm and control module 322 receives inputs from MPD current measurement module 318 and CDR/sampling data module 324.

As described above, MPD 310 is optically coupled to laser 308 and generates a bandwidth limited current in relation to the optical power transmitted by laser 308. MPD current measurement module 318 receives the current generated by MPD 310. In an embodiment, MPD current measurement module 318 can determine an average power transmitted by laser 308 based on the current generated by MPD 310. MPD current measurement module 318 sends the measured current and/or information regarding a detected power to algorithm and control module 322.

Algorithm and control module 322 also receives information from data input signal 314. To get this information, clock and data recovery (CDR)/sampling data module 324 extracts contents of the data input signal 314 using clock source 320. CDR/sampling data module 324 extracts the '1's and '0's from data input signal 314 and sends the extracted information to algorithm and control module 322. CDR/sampling data module 324 can either function as a true CDR module or as a sampling data module, where clock source 320 is just accurate enough with respect to the incoming data that it samples the bits within a predefined level of accuracy.

By receiving information from MPD current measurement module 318 and CDR/sampling data module 324, algorithm and control module 322 can determine an error between a received data input signal 314 and the output of MPD 310, which generates a current based on the transmission of data input signal 314 by laser 308. As previously discussed, MPD 310 is exposed to a sufficient percentage of the optical power transmitted by laser 308 such that MPD 310 generates a current based on this optical power. Because MPD 310 is bandwidth limited, the signal generated by MPD 310 reflects the sum of the relative weighted contributions of N data bits that were previously transmitted by laser 308, and laser driver control module 302 can compensate for the accumulated effect present in the signal generated by MPD 310 and measured by MPD current measurement module 318.

In an embodiment, the relationship between the power of the signal transmitted by laser 308 and the transient current detected by MPD current measurement module 318 (e.g., as represented by the current generated by MPD 310) can be characterized by a transfer function H(f). By determining transfer function H(f) over a range of supported frequencies, laser driver control module 302 can use transfer function H(f) to better extract the laser transmit level of '1' or '0' from the measured power from MPD current measurement module 318 relative to the data to be transmitted. Using these calculations, laser driver control module 302 can more accurately determine the bias current and/or the modulation current of laser driver 304. For example, algorithm and control module 322 can configure the bias current level (e.g., the current used to transmit '0's for the case of burst mode direct modulated laser driver) and the modulation current level (e.g., the extra current added to the bias current used to transmit '1's in a signal) of laser driver 304.

3.3 Determination of Transfer Function H(f)

As previously discussed, in an embodiment, MPD 310 is bandwidth limited. For example, in an embodiment, MPD current measurement module 318 can use current measurements from MPD 310 to determine the sum of the relative weighted contributions of Ndata bits that were previously transmitted by laser 308. Thus, in an embodiment, MPD 310 does not generate a different current signal based on each transmitted '1' or '0' but rather generates a current based on bits transmitted by laser 308 over a certain period (for example, over six bits of a transmitted signal).

The current generated by MPD 310 and average power detected by MPD current measurement module 318 over any given period can be offset by an error. For example, if M is 6 and laser 308 transmits 5 '0's and then 1 bit of a '1' in a signal, the average power detected by MPD current measurement module 318 may be approximated as 0 offset by ⅙ of a bit of a '1.' This error can be represented by transfer function H(f), and laser driver control module 302 can compensate for this error by determining H(f) based on the average power determined by MPD current measurement module 318 and knowledge of the contents of data input signal 314 (e.g., knowledge of the location of the '1's and '0's in the digital input signal 314, and how many bits wide the '1's and '0's are when transmitted by laser 310). Using transfer function H(f) and the transmitted data sequence from laser driver 304, the control module 302 can calculate the effective change in the measured signal from the actual level of '1' and/or '0.' Since two variables are not known (each measurement is a combination of the true level of '1' and the true level of '0'), the algorithm can use two separate measures of the current generated by MPD 310 (two samples that might be more dominated by either '1' or a '0') and can extract both values of '0' and '1' as they are detected by MPD 310.

For example, in an embodiment, after CDR/sampling data module 324 parses a sequence of bits from a transmission of data input signal 314, CDR/sampling data module 324 generates a N-bit wide vector DATA(N) and sends this vector to algorithm and control module 322. If algorithm and control module 322 is aware of the relationship between the power of the signal transmitted by laser 308 and the average power detected by MPD current measurement module 318, algorithm and control module 322 can more accurately control the bias current and/or modulation current of laser driver 304. As previously discussed, this relationship can be characterized by transfer function H(f). After algorithm and control module 322 initially computes H(f) over a range of supported frequencies to determine how the control loop responds to various data input signals, algorithm and control module 322 can use the computed H(f) matrix to predict average power measurements that will be generated by MPD current measurement module 318 after DATA(N) is transmitted. Thus, using H(f) and DATA(N), algorithm and control module can adjust the bias current and/or the modulation current of laser driver 304 to a preferred value before DATA(N) is transmitted by laser 308.

In an embodiment, to initially determine H(f), algorithm and control module 322 measures the average power from MPD current measurement module 318 over a range of supported frequencies to obtain a full characterization of the control loop formed by laser driver 304, laser 308, MPD 310, and laser driver control module 302. For example, algorithm and control module 322 can instruct pattern generator module 326 to generate a digital data test pattern signal (e.g., during a calibration phase). Pattern generator module 326 transmits this digital data test pattern signal to MUX 316, which passes the digital data test pattern signal to laser driver 304 instead of data input signal 314.

Algorithm and control module 322 can obtain measurements, via MPD current measurement module 318, of the average signal power and/or peak to peak signal measurements resulting from the generation of the digital data test pattern signal. In an embodiment, after laser 308 transmits the digital data test pattern signal, MPD current measurement module 318 detects the average power of the last M bits of the transmitted signal, offset by some error, and sends this information to algorithm and control module 322. Algorithm and control module 322 can store these measurements, for example, in one or more tables. Algorithm and control module 322 can then instruct pattern generator 326 to change the frequency of the generated digital data test pattern signal until peak to peak signal measurements and average power measurements are obtained over a full range of supported frequencies. The resulting table(s) of measurements characterizes the response of the control loop for all supported frequencies and can be used to determine H(f).

Figure 5:
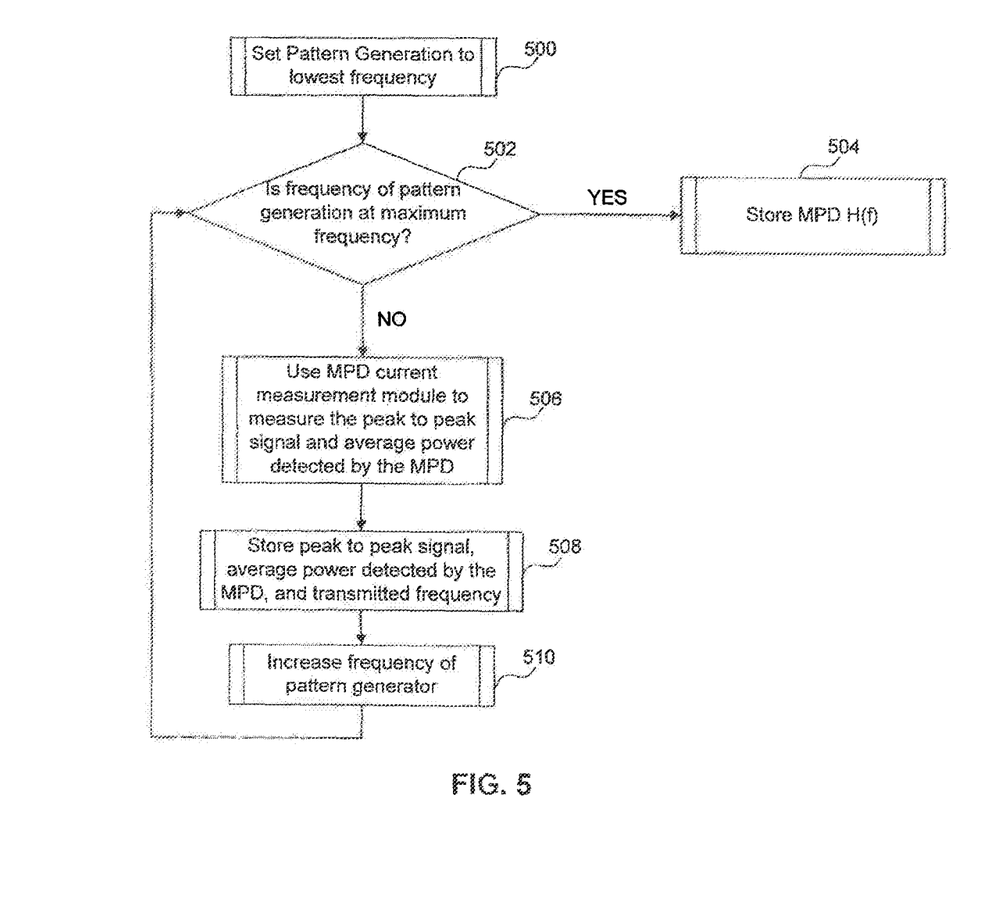
FIG. 5 is a flowchart of a method for extracting a transfer function in accordance with an embodiment of the present disclosure.

FIG. 5 is a flowchart of a method for extracting a transfer function H(f) for a laser driver control module in accordance with an embodiment of the present disclosure. In step 500, pattern generation is set to a lowest supported frequency. For example, algorithm and control module 322 sets pattern generator module 326 to the lowest supported frequency. In step 502, a determination is made regarding whether the frequency of the pattern generation (e.g., generated by pattern generator 326) is at the maximum supported frequency (which can be interpreted as an indication to stop the analysis cycle). If the frequency of pattern generation is not at the maximum supported frequency, the peak to peak signal and average power of the signal transmitted by laser 308 is measured in step 506 (e.g., by MPD current measurement module 318). In step 508, the peak to peak signal, average power, and transmitted frequency are stored (e.g., in a register). The frequency of pattern generation is increased in step 510. For example, algorithm and control module 322 can instruct pattern generator module to increase the frequency of the generated signal. Steps 502, 506, 508, and 510 are then repeated until a determination is made at step 502 that the pattern generation has reached a maximum supported frequency. The corresponding matrix is then stored as the transfer function H(f).

In an embodiment, to use H(f) above (and/or to increase the accuracy of the transfer function H(f)), further calculation on the H(f) matrix may be performed. For example, algorithm and control module 322 can generate a sample by sample decay amplitude factor so that algorithm and control module 322 can easily calculate and extract the relevant value of '0' and/or '1' from any current generated by MPD 310. The measured MPD current can be represented as the sum of each previous transmitted bit multiplied by the corresponding decay value according to the equation:

$$Measured_{MPD_{Current}} = \sum_{k=0}^{NN} h_k \cdot L_k$$

In the equation above, $h_k$ is the decay value extracted from H(k) (or contribution value relevant to the specific previous k bit), and $L_k$ is the optical power of the previous k bit. For example, the variable "k" indicates a specific bit transmitted k data bits ago, and h(k) is the effective contribution of that data bit to the sampled measurement value of the current generated by MPD 310 and sampled by MPD current measurement module 318. In an embodiment, $h_k$ can be generated based on the effective bandwidth of MPD 310 and the transfer function H(k).

In an embodiment, algorithm and control module 322 can use $h_k$ and DATA(N) from CDR/sampling data module 324 and can compare the expected value from MPD current measurement module 318 with the measured value from MPD current measurement module 318. Algorithm and control module 322 can then determine the error in the bias and/or modulation current of laser driver 304. In a direct current (DC) coupled driving scheme, the '0' level can be derived from the residual modulation current in its off state, and the '1' level can be derived from the sum of the bias and the modulation currents. In an alternating current (AC) driving scheme, the bias current can drive the average power level of the laser, and the modulation current can control the '0' and the '1' levels, where the '0' level is determined by bias current−modulation current and the '1' level is determined by the bias current+the modulation current.

3.4 Error Compensation

As previously discussed, transfer function H(f) can be used to compensate for errors detected in average power measurements taken using MPD current measurement module 318. For example, when a data sequence TX-DATA-SEQUENCE is transmitted by laser 308, MPD current measurement module 318 measures the average power of the transmitted data sequence as having the value TX-DATA-SEQUENCE*h(n), where * represents convolution, and where h(n) is the time domain transform of H(f). Thus, algorithm and control module 322 can compute a measured value (e.g., a measured current or a measured average power) using the equation measured_value=TX-DATA-SEQUENCE*h(n). Algorithm and control module 322 can then calculate a value compensated_measurement by convolving measured_value by the inverse of h(n). Algorithm and control module 322 can then use the calculated compensated_measurement value to determine whether to modify the bias current or the modulation current of laser driver 304 so that laser driver 304 transmits a '0' as close as possible to the target bias point and a '1' as close as possible to the target modulation point such that a receiver can easily differentiate between transmitted '0's' and '1's.'

As previously discussed, MPD 310 is bandwidth limited, and laser 308 transmits at a higher bandwidth than the bandwidth of MPD 310. Thus, in an embodiment, control module 302 analyzes a subset of all signals transmitted by laser 308 (e.g., those signals with low bandwidth information) because these signals can have more significant signals monitored by bandwidth limited MPD 310. Signals with consecutive '1's' and '0's' contain lower bandwidth information, so, in an embodiment, laser driver control module 302 analyzes signals transmitted by laser 308 that have a certain length of consecutive bits (e.g., 5 bits). Bit sequences containing a predetermined amount of consecutive '1's' and/or '0's' can be referred to as supported bit sequences.

In an embodiment, all supported bit sequences of length M (where M is the bandwidth of MPD 310) that can be transmitted by laser 308 can be stored in one or more tables. For example, in an embodiment, a first table SUPPORTED-DATA-ONE(M) can store all supported bit sequences of length M having a predetermined amount of consecutive '1's,' and a second table SUPPORTED-DATA-ZERO(M) can store all supported bit sequences of length M having a predetermined amount of consecutive '0's.' As previously discussed, the current measured by MPD current measurement module 318 when these sequences are transmitted by laser 308 can also be stored in the SUPPORTED-DATA-ONE(M) table and the SUPPORTED-DATA-ZERO(M) table. In an embodiment, it is also possible to detect and calculate supported bit sequences strictly based on real time calculations. In an embodiment, these real time calculations can be the same calculations used to generate the rows in the SUPPORTED-DATA-ONE(M) table and the SUPPORTED-DATA-ZERO(M) table.

Together, the SUPPORTED-DATA-ONE(M) and SUPPORTED-DATA-ZERO(M) tables can be used to determine transfer function H(f). These tables can be used to implement a data aware control loop to control the bias current and modulation current of laser driver 304. In an embodiment, the SUPPORTED-DATA-ONE(M) table can be used by algorithm and control module 322 to set the target '1' level for a modulation current, and the SUPPORTED-DATA-ZERO(M) table can be used by algorithm and control module 322 to set the target '0' level for a bias current.

For example, as previously discussed, CDR/sampling data module 324 extracts a N-bit wide vector DATA(N) and sends this vector to algorithm and control module 322. If algorithm and control module 322 determines that one of the values in the SUPPORTED-DATA-ONE(M) table is present in the last M bits of DATA(N), algorithm and control module 322 can compensate for the error in the current measured by MPD current measurement module 318 using the calculated compensated_measurement value that can be generated based on the known transfer function H(f) of the control loop. This compensated_measurement value can be compared to a target '1' level signal from MPD 310 for a modulation current, and algorithm and control module 322 can determine that the modulation current of laser driver 304 should be increased (or decreased) until the compensated_measurement value of the signal generated by MPD 310 is equal to (or, for example, within a predefined range of) the target level for that signal.

Likewise, if algorithm and control module 322 determines that one of the values in the SUPPORTED-DATA-ZERO(M) table is present in the last M bits of DATA(N), algorithm and control module 322 can compensate for the error in the current measured by MPD current measurement module 318 using the calculated compensated_measurement value. The compensated_measurement value can be compared to a target '0' level for a bias current, and algorithm and control module 322 can determine that the bias current of laser driver 304 should be decreased (or increased) until the compensated_measurement value is equal to (or, for example, within a predefined range of) the target level of the measured signal.

Using the systems and methods described above, algorithm and control module 322 can use a compensated measurement value generated from a known control loop transfer function H(f) to determine whether to modify the bias current or the modulation current of laser driver 304 so that laser driver 304 transmits a '0' as close as possible to the target optical power level of '0' and a '1' as close as possible to the target optical power level of '1' so that a receiver can easily differentiate between a transmitted '0' and a transmitted '1.' Thus, systems and methods described herein can be used to generate an accurate bias current and an accurate modulation current for a laser driver using an automatic calibration process.

3.5 Method for Error Compensation

Figure 6:
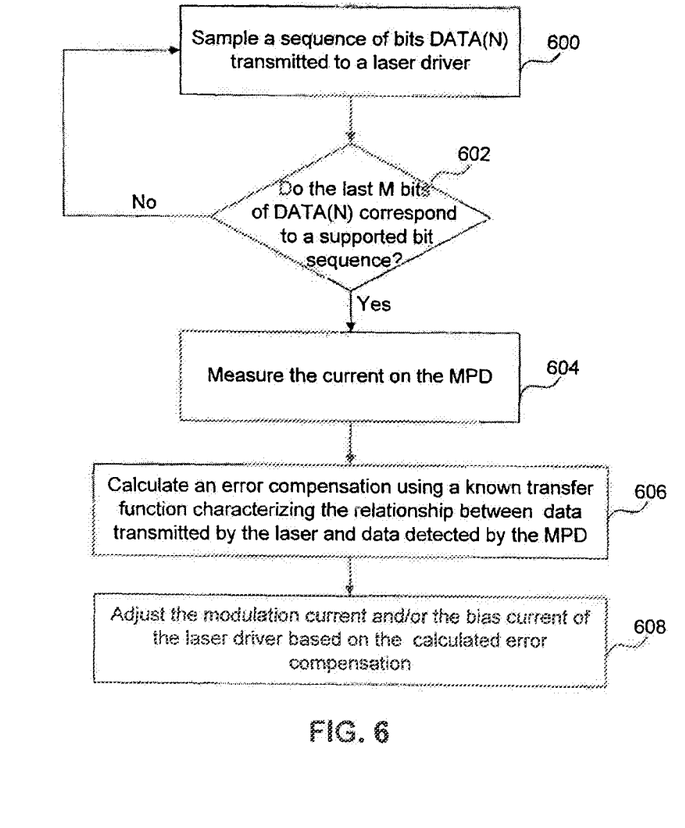
FIG. 6 is a flowchart of a method for error compensation for a laser driver in accordance with an embodiment of the present disclosure.

FIG. 6 is a flowchart of a method for error compensation for a laser driver in accordance with an embodiment of the present disclosure. In step 600, a sequence of bits DATA(N) is sampled from data transmitted to a laser driver. For example, CDR/sampling data module 324 samples a sequence of bits DATA(N) from data input signal 314. In step 602, a determination is made (e.g., by algorithm and control module 322) regarding whether the last M bits (where M is directly correlated to the bandwidth of MPD 310) of DATA(N) correspond to a supported bit sequence. For example, the last M bits of DATA(N) can be compared with table(s) of supported bit sequences (e.g., a bit sequence listed as one of the values in the SUPPORTED-DATA-ZERO(M) table or the SUPPORTED-DATA-ONE(M) table). If the last M bits of DATA(N) correspond with a supported bit sequence, laser driver control module 302 can analyze the transmitted sequence, with the effective contribution of each of the previously transmitted bits, based on the expected power levels. Laser driver control module 302 and can adjust the bias and/or modulation current of laser driver 304 based on the calculated information, and the method proceeds to step 604. Otherwise, the method returns to step 600.

In step 604, the current on MPD 310 is measured (e.g., by MPD current measurement module 318). In step 606, an error compensation (e.g., compensated_measurement) is calculated (e.g., by algorithm and control module 322) using known transfer function H(f). As previously discussed, transfer function H(f) can be calculated using the method of FIG. 5. For example, the value compensated_measurement can be calculated, as discussed above, by convolving measured_value by the inverse of h(n), where h(n) is the time domain transform of H(f). In an embodiment, the following formula can be used to calculate the error compensation:

$$Measured_{MPD_{Current}} = \sum_{k=0}^{NN} h_k \cdot L_k$$

In an embodiment, multiple values of compensated_measurement can be averaged using multiple samples of measured_value to increase accuracy. In step 608, the modulation current and/or the bias current of laser driver 304 is adjusted (e.g., by algorithm and control module 322) based on the calculated error compensation. If the last M bits of DATA(N) correspond to a supported bit sequence in the SUPPORTED-DATA-ZERO(M) table, the bias current can be adjusted, and if the last M bits of DATA(N) correspond to a supported bit sequence in the SUPPORTED-DATA-ONE(M) table, the modulation current can be adjusted. For example, the compensated_measurement value can be compared to a target '0' level for a bias current or a target '1' level for a modulation current, and algorithm and control module 322 can determine that the bias current and/or the modulation current of laser driver 304 should be decreased (or increased) until the compensated_measurement value is equal to (or, for example, within a predefined range of) the target level for the bias current or the target level for the modulation current.

4. CONCLUSION

It is to be appreciated that the Detailed Description, and not the Abstract, is intended to be used to interpret the claims. The Abstract may set forth one or more but not all exemplary embodiments of the present disclosure as contemplated by the inventor(s), and thus, is not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The representative signal processing functions described herein can be implemented in hardware, software, or some combination thereof. For instance, the signal processing functions can be implemented using computer processors, computer logic, application specific circuits (ASIC), digital signal processors, etc., as will be understood by those skilled in the art based on the discussion given herein. Accordingly, any processor that performs the signal processing functions described herein is within the scope and spirit of the present disclosure.

The above systems and methods may be implemented as a computer program executing on a machine, as a computer program product, or as a tangible and/or non-transitory computer-readable medium having stored instructions. For example, the functions described herein could be embodied by computer program instructions that are executed by a computer processor or any one of the hardware devices listed above. The computer program instructions cause the processor to perform the signal processing functions described herein. The computer program instructions (e.g. software) can be stored in a tangible non-transitory computer usable medium, computer program medium, or any storage medium that can be accessed by a computer or processor. Such media include a memory device such as a RAM or ROM, or other type of computer storage medium such as a computer disk or CD ROM. Accordingly, any tangible non-transitory computer storage medium having computer program code that cause a processor to perform the signal processing functions described herein are within the scope and spirit of the present disclosure.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments, and further the invention should be defined only in accordance with the following claims and their equivalents.

What is claimed is:

1. A system comprising:
a laser driver configured to drive a laser;
a monitor photo diode (MPD) coupled to the laser, wherein the MPD is configured to generate a current based on a signal generated by a laser; and
a laser driver control module coupled to the MPD and the laser driver, wherein the laser driver control module is configured to:
determine, for a range of frequencies supported by the laser driver, an average power of the signal generated by the laser based on the current generated by the MPD;
determine, based on the average power, a relationship between the signal and the current;
sample a sequence of bits transmitted to the laser driver;
calculate a compensated measurement value using the sequence of bits and the determined relationship; and
adjust a bias current or a modulation current of the laser driver based on the calculated compensated measurement value.

2. The system of claim 1, wherein the MPD is exposed to a sufficient percentage of optical power transmitted by the laser such that the MPD generates the current, and wherein the current represents the optical power.

3. The system of claim 1, wherein the laser driver control module includes an MPD current measurement module coupled to an output of the MPD, and wherein the MPD current measurement module is configured to receive the current generated by the MPD.

4. The system of claim 1, wherein the laser driver control module includes a sampling data module, and wherein the sampling data module is configured to sample the sequence of bits transmitted to the laser driver.

5. The system of claim 1, wherein the laser driver control module includes an algorithm and control module, and wherein the algorithm and control module is configured to calculate the compensated measurement value.

6. The system of claim 1, wherein the relationship is a transfer function that characterizes a control loop formed by the laser, the laser driver, the MPD, and the laser driver control module.

7. A system comprising:
a laser driver configured to drive a laser;
a monitor photo diode (MPD) coupled to the laser; and
a laser driver control module coupled to the MPD and the laser driver, wherein the laser driver control module is configured to:
sample a sequence of bits received by the laser driver,
receive a current generated by the MPD,
calculate a compensated measurement value using the sequence of bits, the current generated the MPD, and a transfer function characterizing a relationship between the sequence of bits and the current generated by the MPD, and
adjust a bias current or a modulation current of the laser drive based on the calculated compensated measurement value, wherein the transfer function is computed by determining, for a plurality of frequencies supported by the laser driver, an average power measurement of a signal generated by the laser corresponding to the sampled sequence of bits.

8. A method comprising:
sampling a sequence of bits input into a laser driver that drives a laser;
measuring a current generated by a monitor photo diode (MPD), wherein the MPD is exposed to a sufficient percentage of optical power transmitted by the laser such that the MPD generates the current representing the optical power;
determining, for a range of frequencies supported by the laser driver, an average power of a signal generated by the laser based on the current;
determining, based on the average power, a relationship between the signal and the current;
calculating a compensated measurement value using the sequence of bits and the determined relationship; and
adjusting a bias current or a modulation current of the laser driver based on the calculated compensated measurement value.

9. The method of claim 8, further comprising:
generating a vector of values h(k) based on a bandwidth of the MPD and the relationship, wherein k indicates a data bit previously transmitted by the laser, and wherein h(k) represents the effective contribution of the data bit to the measured current.

10. The method of claim 9, further comprising:
calculating the compensated measurement value using the vector of values h(k).

11. The method of claim 8, further comprising:
determining an error in the bias current or the modulation current based on a comparison between an expected current measurement value and the current generated by the MPD.

12. The method of claim 8, wherein adjusting the bias current or the modulation current further comprises:
adjusting the bias current using a residual modulation current in an off state; and
adjusting the modulation current based on a sum of the bias current and the modulation current.

13. The method of claim 8, wherein the bias current drives an average power level of the laser, and wherein the modulation current controls a '0' level and a '1' level of the laser.

14. A laser driver control module configured to initiate an adjustment of a bias current or a modulation current of a laser driver that drives a laser, wherein the laser driver control module comprises:
a sampling data module coupled to a clock, wherein the sampling data module is configured to sample a data input stream;
a monitor photo diode (MPD) current measurement module configured to determine, for a range of frequencies supported by the laser driver, an average power of a signal generated by the laser based on a current generated by an MPD coupled to the laser; and
an algorithm and control module coupled to an output of the MPD current measurement module and the sampling data module, wherein the algorithm and control module is configured to:
determine, based on the average power, a relationship between the signal and the current, and
initiate, based on the sampled data input stream and the determined relationship, the adjustment of the bias current or the modulation current.

15. The laser driver control module of claim 14, wherein the MPD current measurement module is further configured to measure the current over the range of frequencies to determine the average power.

16. The laser driver control module of claim 14, wherein the algorithm and control module is further configured to calculate a compensated measurement value using a transfer function characterizing the relationship.

17. The laser driver control module of claim 16, wherein the algorithm and control module is further configured to initiate the adjustment of the bias current or the modulation current based on the calculated compensated measurement value.

18. The laser driver control module of claim 16, wherein the transfer function characterizes a control loop formed by the laser driver, a laser coupled to the laser driver, the MPD, and the laser driver control module.

19. The laser driver control module of claim 14, wherein the laser driver control module is implemented in an optical network unit (ONU) of an optical network.

20. The laser driver control module of claim 14, wherein the MPD is exposed to a sufficient percentage of optical power transmitted by a laser coupled to the laser driver such that the MPD generates the current, and wherein the current represents the optical power.

* * * * *